United States Patent
Chang

(10) Patent No.: US 11,378,346 B2
(45) Date of Patent: Jul. 5, 2022

(54) TWO-PHASE METALLIC ALLOYS TO FACILITATE THERMAL ENERGY STORAGE OF A SYSTEM ON CHIP

(71) Applicant: Intel Corporation, Santa Clara, CA (US)

(72) Inventor: Je-Young Chang, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 768 days.

(21) Appl. No.: 16/147,548

(22) Filed: Sep. 28, 2018

(65) Prior Publication Data

US 2020/0103177 A1 Apr. 2, 2020

(51) Int. Cl.
| | |
|---|---|
| *H01L 23/36* | (2006.01) |
| *F28D 20/02* | (2006.01) |
| *H01L 23/373* | (2006.01) |
| *H01L 23/367* | (2006.01) |
| *C09K 5/06* | (2006.01) |
| *H01L 49/02* | (2006.01) |

(52) U.S. Cl.
CPC ............ *F28D 20/025* (2013.01); *C09K 5/063* (2013.01); *F28D 20/023* (2013.01); *H01L 23/3677* (2013.01); *H01L 23/3736* (2013.01); *H01L 28/40* (2013.01)

(58) Field of Classification Search
CPC ...................................................... H01L 23/36
See application file for complete search history.

(56) References Cited

U.S. PATENT DOCUMENTS

| | | | | |
|---|---|---|---|---|
| 4,807,696 | A * | 2/1989 | Colvin | F28D 20/023 |
| | | | | 126/400 |
| 10,181,800 | B1 * | 1/2019 | Nayar | H01M 10/425 |
| 2008/0316344 | A1 * | 12/2008 | Yamamiya | G02B 7/09 |
| | | | | 348/340 |

OTHER PUBLICATIONS

Yang et al., "Experimental and numerical investigation of low melting point metal based PCM heat sink with internal fins" International Communications in Heat and Mass Transfer 87 (2017) 118-124 (Year: 2017).*
Manasijevic et al., "Study of Microstructure and Thermal Properties of the Low Melting Bi—In—Sn Eutectic Alloys" Materials Research. 2018; 21(6): e20180501; https://doi.org/10.1590/1980-5373-MR-2018-0501 (Year: 2018).*

* cited by examiner

*Primary Examiner* — Christopher A Johnson
(74) *Attorney, Agent, or Firm* — Schwabe, Williamson & Wyatt P.C.

(57) ABSTRACT

Embodiments herein relate to systems, apparatuses, processing, and techniques related to patterning one or more sides of a thin film capacitor (TFC) sheet, where the TFC sheet has a first side and a second side opposite the first side. The first side and the second side of the TFC sheet are metal and are separated by a dielectric layer, and the patterned TFC sheet is to provide at least one of a capacitor or a routing feature on a first side of a substrate that has the first side and a second side opposite the first side.

19 Claims, 10 Drawing Sheets

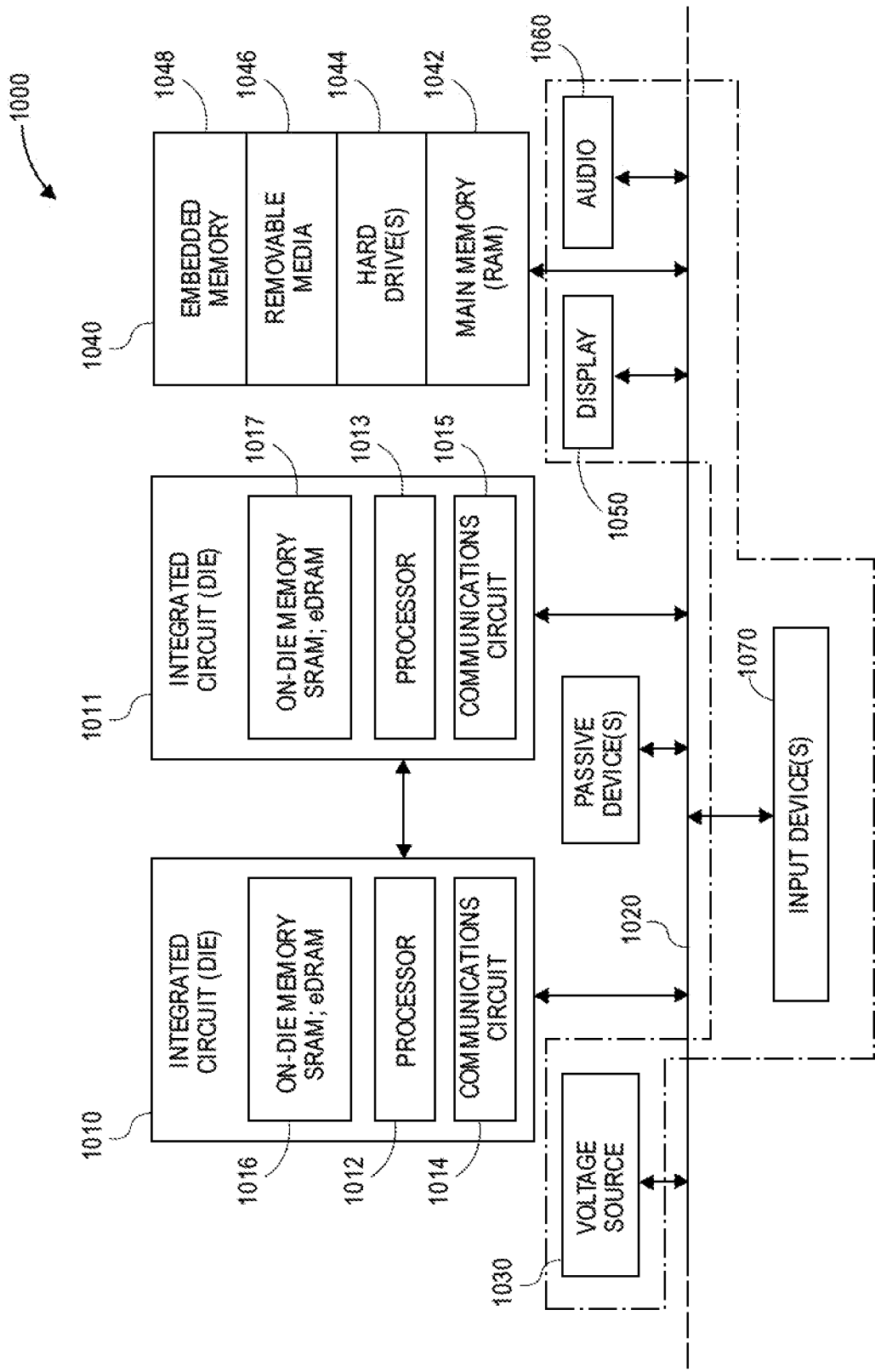

TWO-PHASE METALLIC ALLOYS TO FACILITATE THERMAL ENERGY STORAGE OF A SYSTEM ON CHIP

FIELD

Embodiments of the present disclosure generally relate to the field of package assemblies, and in particular using two-phase metallic alloys (TPMA) for storing thermal energy.

BACKGROUND

The background description provided herein is for the purpose of generally presenting the context of the disclosure. Unless otherwise indicated herein, the materials described in this section are not prior art to the claims in this application and are not admitted to be prior art by inclusion in this section.

Continued reduction in end product size of mobile electronic devices such as smart phones and ultrabooks is a driving force for the development of reduced size systems in package components. Increased power requirements within these package components has also increased thermal generation of components within the packages.

BRIEF DESCRIPTION OF THE DRAWINGS

FIG. 10 is a schematic of a computer system 1000, in accordance with an embodiment of the present invention.

DETAILED DESCRIPTION

Figure 1A:
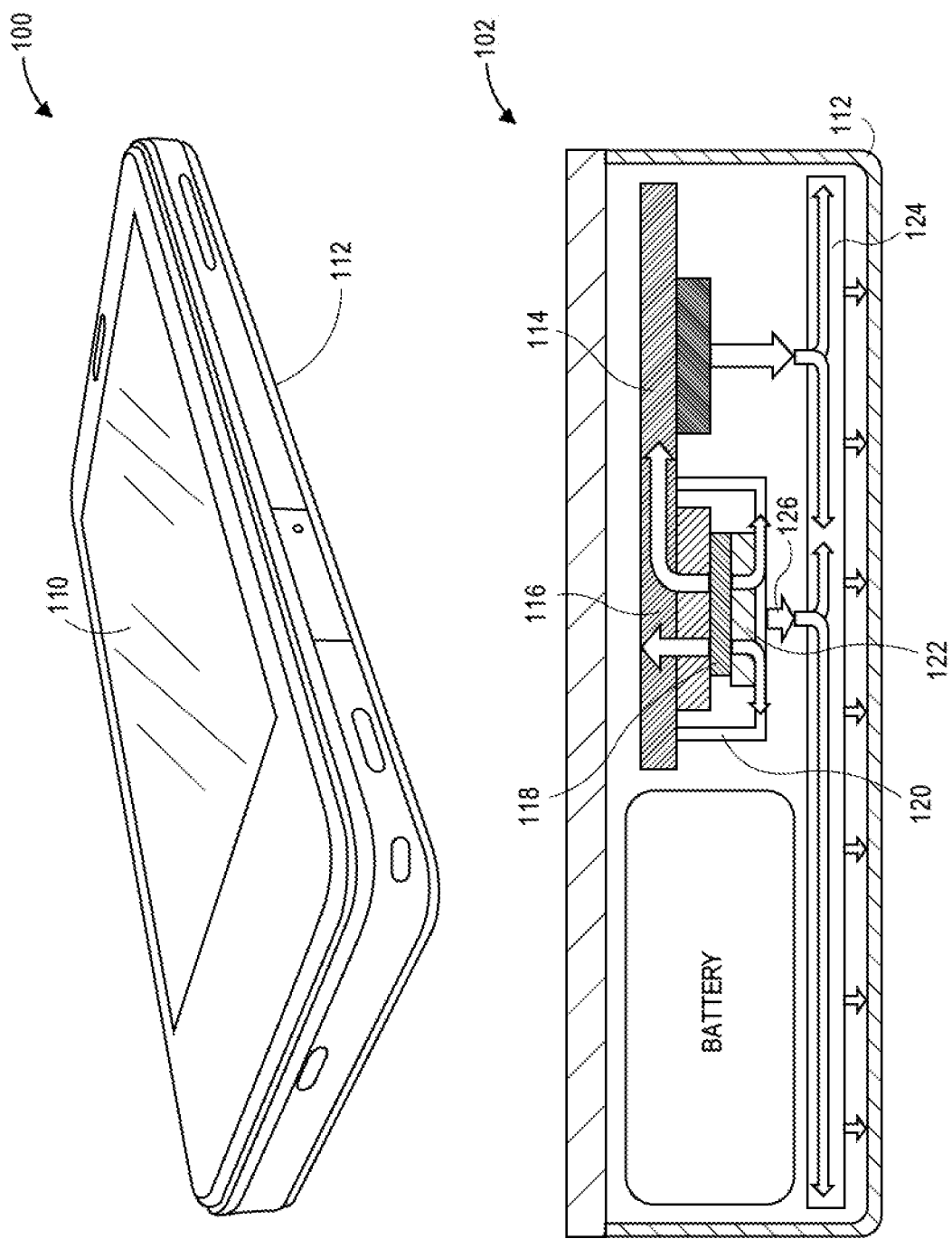
FIG. 1A illustrates an example of a phase change material (PCM) used in place of a gap pad thermal interface material (TIM) to improve transient cooling of a system-on-a-chip (SoC) for a smartphone, in accordance with embodiments.

Embodiments of the present disclosure may generally relate to thermal energy storage devices that include TPMAs. In embodiments, a TPMA may also be referred to as an "off-eutectic alloy" as discussed further below. Embodiments may relate to a heatsink that includes a plurality of metallic constituents that form a TPMA, where the metallic constituents are PCMs and where the TPMA includes a ratio of quantities of each of the metallic constituents. The TPMA has a liquidus temperature value and a solidus temperature value and has at least a liquid phase and at least a solid phase when a temperature value of the TPMA is between the liquidus temperature value and the solidus temperature value. The TPMA, when at a temperature between the liquidus temperature value and the solidus temperature value, is to facilitate thermal energy storage when coupled to a heat source.

Embodiments may also be directed to a method that includes determining a temperature range for heatsink hotspot. The method may also include identifying a plurality of metallic constituents to form a TPMA to thermally couple to the heatsink hotspot, where the metallic constituents are PCM. The method may also include determining a ratio of quantities of each of the metallic constituents based at least upon the determined temperature range, wherein a low end of the temperature range is a liquidus temperature value for the TPMA and a high end of the temperature range is a solidus temperature value for the TPMA. The method may also include combining the plurality of the metallic constituents, respectively, according to the ratio of quantities of each of the metallic constituents to form the TPMA.

The storage of thermal energy in the form of sensible and latent heat has important applications of thermal management. Heat storage in the form of sensible heat indicates the lack of a phase change of a material, for example from solid to liquid. Heat storage in the form of latent heat indicates a phase change of a material.

Applications of storage of thermal energy may include temporary relaxation of hot spots in electronic devices, such as laptops, smartphone, and batteries for electric-drive vehicles. Applications may also include energy management, for example conservation of the waste heat and solar energy in industry and buildings. There are many other similar examples of applications.

Latent heat storage is one of the most efficient ways of storing thermal energy using PCM, for example, paraffin, hydrated salts, etc. However, while most of the legacy PCMs have reasonably high thermal energy storage densities, they may also have very low thermal conductivities, thus requiring a large surface area for the PCM in legacy system design.

Therefore, it would be an advantage for thermal energy storage material to have higher thermal conductivity as well as higher thermal capacity. In embodiments, systems constructed with TPMA may support the demands for higher thermal capacity, higher thermal conductivity, and higher operation stability, which are critical aspects in the applications of thermal management, and energy management.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

Various operations may be described as multiple discrete operations in turn, in a manner that is most helpful in understanding the claimed subject matter. However, the order of description should not be construed as to imply that these operations are necessarily order dependent.

As used herein, the term "module" may refer to, be part of, or include an ASIC, an electronic circuit, a processor (shared, dedicated, or group) and/or memory (shared, dedicated, or group) that execute one or more software or firmware programs, a combinational logic circuit, and/or other suitable components that provide the described functionality.

Various Figures herein may depict one or more layers of one or more package assemblies. The layers depicted herein are depicted as examples of relative positions of the layers of the different package assemblies. The layers are depicted for the purposes of explanation, and are not drawn to scale. Therefore, comparative sizes of layers should not be assumed from the figures, and sizes, thicknesses, or dimensions may be assumed for some embodiments only where specifically indicated or discussed.

FIG. 1A illustrates an example of a phase change material (PCM) used in place of a gap pad thermal interface material (TIM) to improve transient cooling of a system-on-a-chip (SoC) for a smartphone, in accordance with embodiments. Diagram 100 shows an example of a smart phone having a display 110 and a back skin 112. Diagram 102 shows various components of the smartphone 100 that include a motherboard 114, a substrate 116, and a SoC 118 that may be the primary processor for the smartphone 100, and an electromagnetic interference (EMI) shield 120. A gap pad TIM 122 may be positioned between the SoC 118 and the EMI shield 120.

In embodiments, the gap pad TIM 122 may be thermally coupled through the EMI shield 120 a skin shield 124, that may serve as a heatsink and, in embodiments, transfer heat from the skin shield 124 to an outside of the case 112. In embodiments, the gap pad TIM 122 may be a PCM.

In this application, energy storage device as implemented in the gap pad TIM 122 can used to capture power bursts of the SoC 118 that appear as increased thermal energy to be to be dissipated. The gap pad TIM 122 may then slowly release the heat into the into the skin shield 124 or otherwise into the smartphone 100 chassis after the power burst subsides, as shown by thermal energy flow 126 into skin shield 124.

Figure 1B:
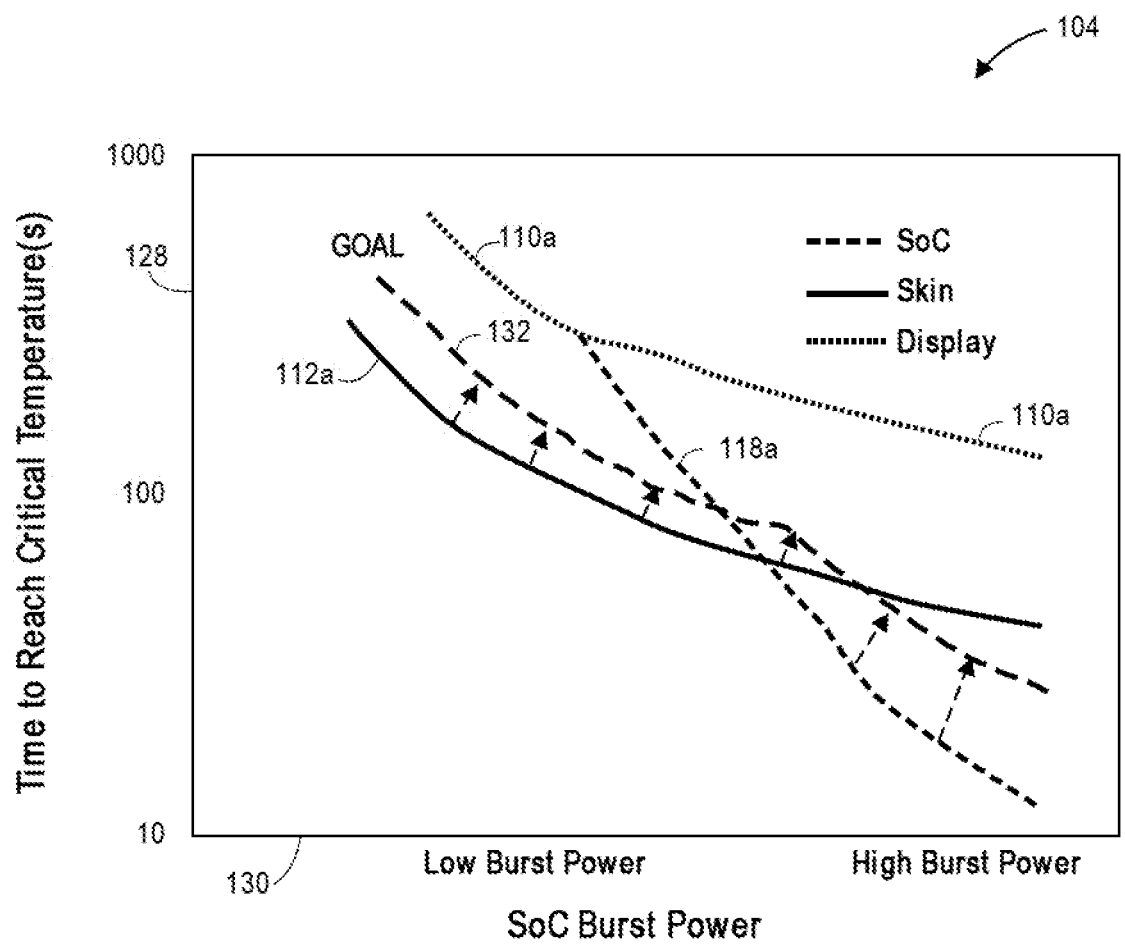
FIG. 1B illustrates a time to reach critical temperature vs. SoC Burst Power graph with respect to the smartphone, in accordance with embodiments.

FIG. 1B illustrates a time to reach critical temperature vs. SoC Burst Power graph with respect to the smartphone, in accordance with embodiments. Diagram 104 is a graph that shows an example result of implementing the gap pad TIM 122 as a TPMA. The Y axis 128 indicates a time to reach critical temperature, and the x-axis 130 indicates a SoC, such as SoC 118, Burst Power, ranging from low to high. A skin line 112a, a display line 110a, and SoC line 118a show various relationships for these components with respect to time needed to reach critical temperature depending upon the SoC Burst Power. A TPMA line 132 shows a change to the skin line 112a and the SoC line 122a that may occur using a TPMA for the gap pad TIM 122.

The TPMA line 132 may indicate, with respect to SoC 118 power bursts, a decrease in hotspots, heat spread more evenly, an extended time to reach critical temperature and/or ergonomic limits, and an extension of time to reach SoC 118 critical limits during high burst power operation.

Figure 2:
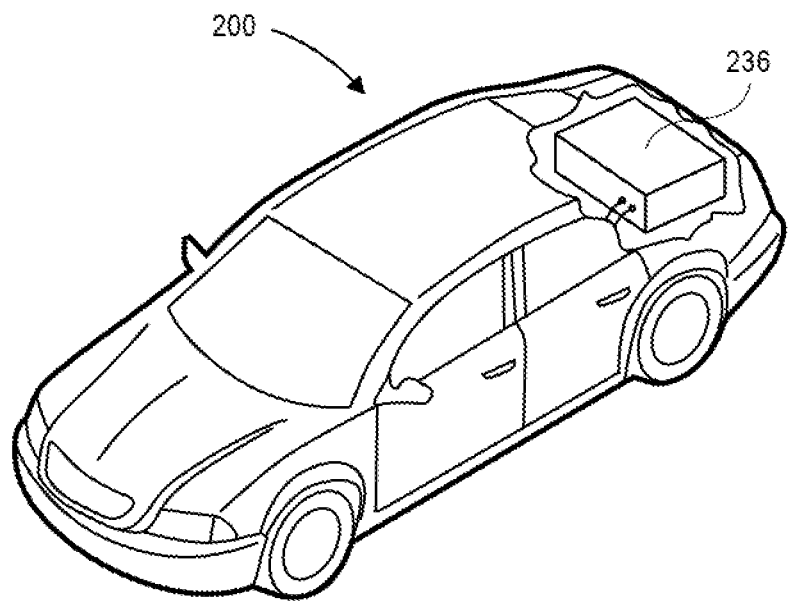
FIG. 2 illustrates an example of PCM devices used to maintain desired temperature range and uniformity of electric drive vehicle batteries, in accordance with embodiments.

FIG. 2 illustrates an example of PCM devices used to maintain desired temperature range and uniformity of electric drive vehicle batteries, in accordance with embodiments. Diagram 200 shows a perspective system view of an Audi Q7 e-tron 3.0 quattro. Diagram 200 shows an example of the vehicle's drive train and batteries 236.

Lithium-ion (Li-ion) batteries 236 are widely used in most of today's electric-drive vehicles (EDVs), hybrids (HEVs), plug-in hybrids (PHEVs), and all-electric vehicles (EVs), because those are smaller and more lightweight than previous nickel-metal hydride (NiMH) technology. However, Li-ion batteries 236 are also more sensitive to overheating, overcharging, and extreme spikes in temperature, which may be known as thermal runaway. To address thermal runway, PCM devices may be thermally coupled to the batteries 236 and may be used to maintain the desired temperature range and temperature uniformity of the batteries.

Figure 3:
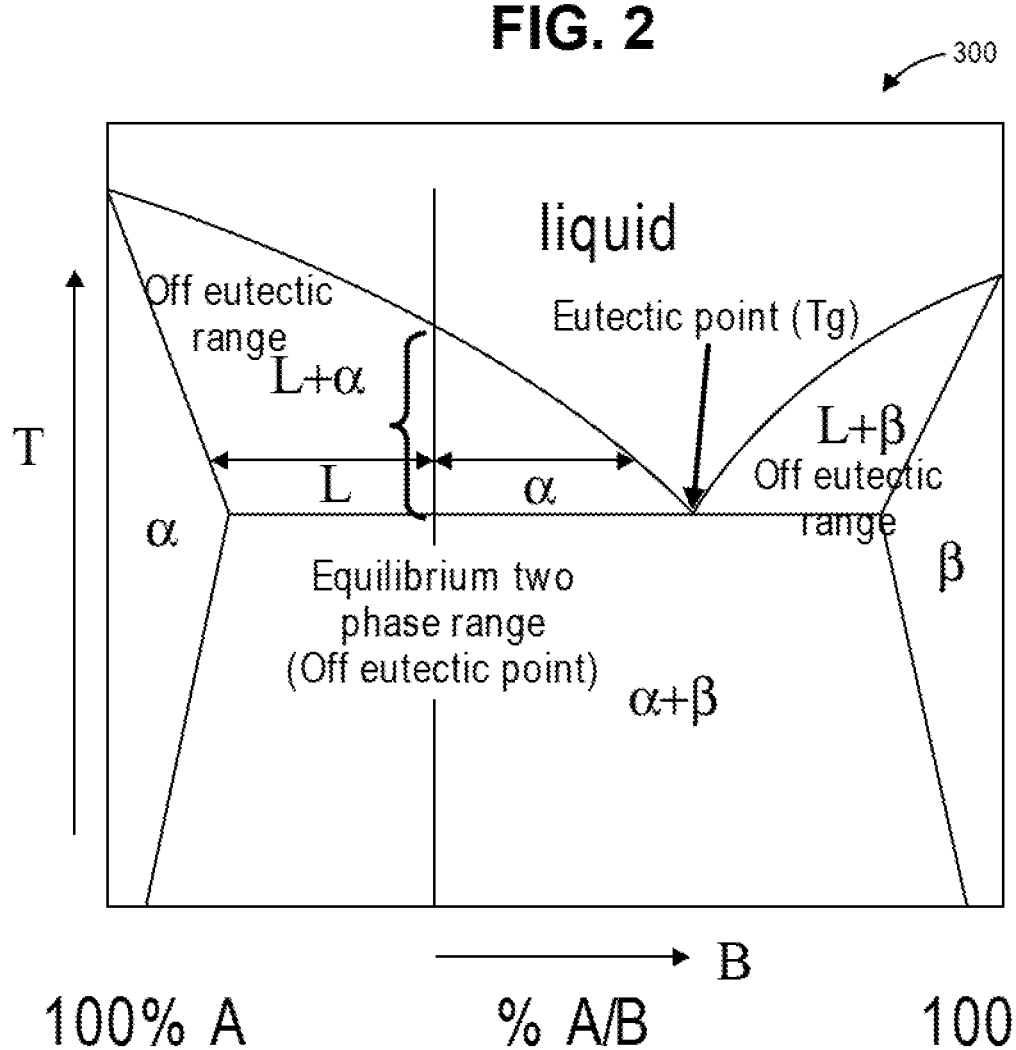
FIG. 3 illustrates a phase diagram of a binary eutectic alloy system for a TPMA range, in accordance with embodiments.

FIG. 3 illustrates a phase diagram of a binary eutectic alloy system for a TPMA range, in accordance with embodiments. Diagram 300 represents a simple phase diagram of a binary eutectic alloy system to show the working principle of a off-eutectic, TPMA range. The TPMA may include PCM metals A and B.

In the alloy system of diagram 300, there are regions where a liquid phase co-exists with a solid phase (i.e., L+$\alpha$ and L+$\beta$ regions), depending on the composition and the temperature of the alloy. When an alloy composition and operating temperature falls into those regions, an alloy system with two phases (i.e., solid and liquid) can be obtained. Since the composition is off from the eutectic point, it is called as "off-eutectic" alloy Such alloy systems can be used for thermal energy storage applications. Specifically, these alloy systems can provide both latent and sensible heat storage capabilities over wide, two-phase temperature range (e.g, 60-110° C.), which can support the demands for higher thermal capacity, higher thermal conductivity, and higher operation stability. Note that a typical PCM material provides a high latent heat storage capability, i.e, Latent Heat of Fusion, $\Delta H$, cross the fixed, phase-change temperature, $T_g$ only.

Referring again to diagram 300, for a binary chemical mixture, the extent of the solid solubility region can be plotted onto the phase diagram and labelled appropriately; $\alpha$, $\beta$, $\alpha+\beta$, L (=liquid), L+$\alpha$, and L+$\beta$. The $\alpha$ and $\beta$ phases are phases that represent a solid solution of elements A and B. A solid solution of B element in A element matrix (i.e. mostly A element) is called $\alpha$, and a solid solution of A element in B element matrix (i.e. mostly B) is called $\beta$. The α+β phase is the mixture of two solid phases at eutectic concentration. The α+L phase is two phase mixture of liquid and solid/primary α phase, while the β+L region is two phase mixture of liquid and solid/primary β phase.

Figure 4:
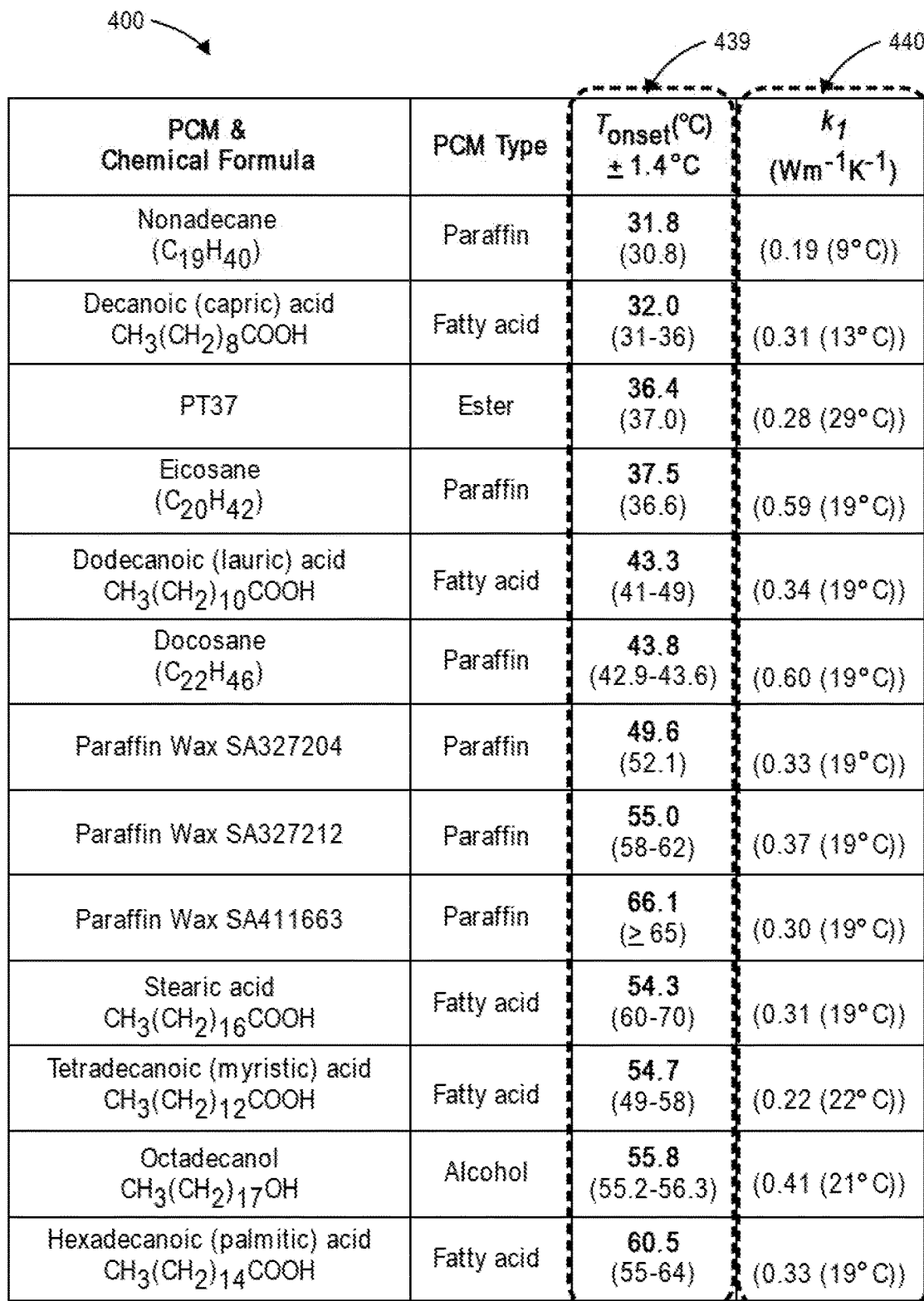
FIG. 4 is an example summary of a comparison of a TPMA to physical properties of 12 popular PCMs, in accordance with embodiments.

FIG. 4 is an example summary of a comparison of a TPMA to physical properties of 12 popular PCMs, in accordance with embodiments. Diagram 400 summarizes the physical properties of 12 most popular PCMs which are non-toxic and readily available. Melting temperatures of PCMs are shown in column 439. The physical properties of PCMs are compared with those of a TPMA, for example Bi—In—Sn, having a two-phase temperature range of 60-110° C. This is in contrast to the value shown in column 440, which shows thermal conductivity values of PCMs (measured at), with values ranging from 9° C. to 29° C.

Figure 5:
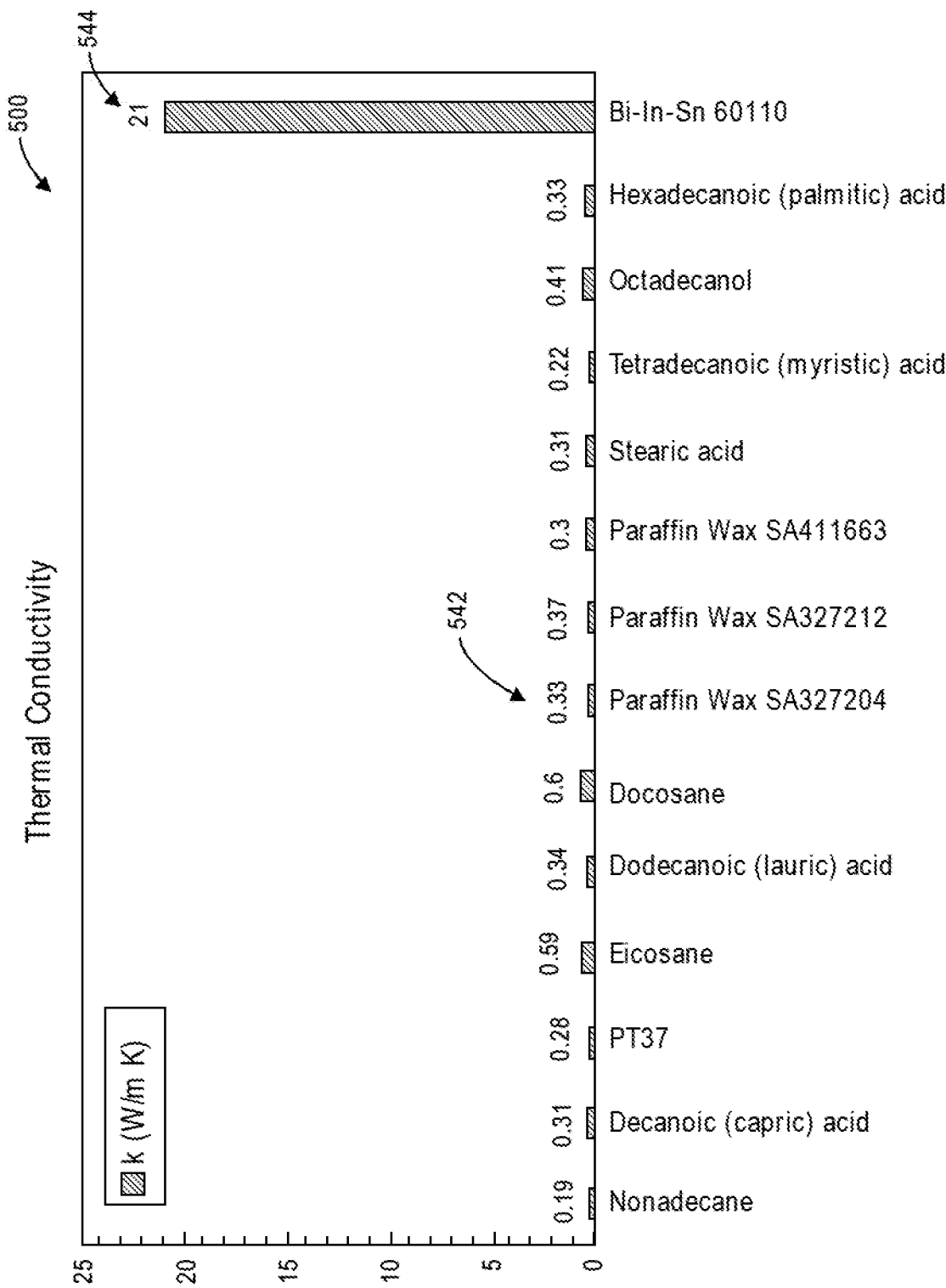
FIG. 5 is an example comparison of thermal conductivity of a TPMA to the 12 popular PCMs, in accordance with embodiments.

FIG. 5 is an example comparison of thermal conductivity of a TPMA to the 12 popular PCMs, in accordance with embodiments. Diagram 500 gives a graphical comparison of the thermal conductivity for the 12 PCM as compared to the TPMA. For example, the thermal conductivity of paraffin 542 (0.33) as compared to the thermal conductivity of the TPMA 544 (21.0) shows the TPMA thermal conductivity is over 70 times higher. As a result, the TPMA is able to spread heat more quickly within its body, thus absorbing more energy at a shorter time of operation.

Figure 6:
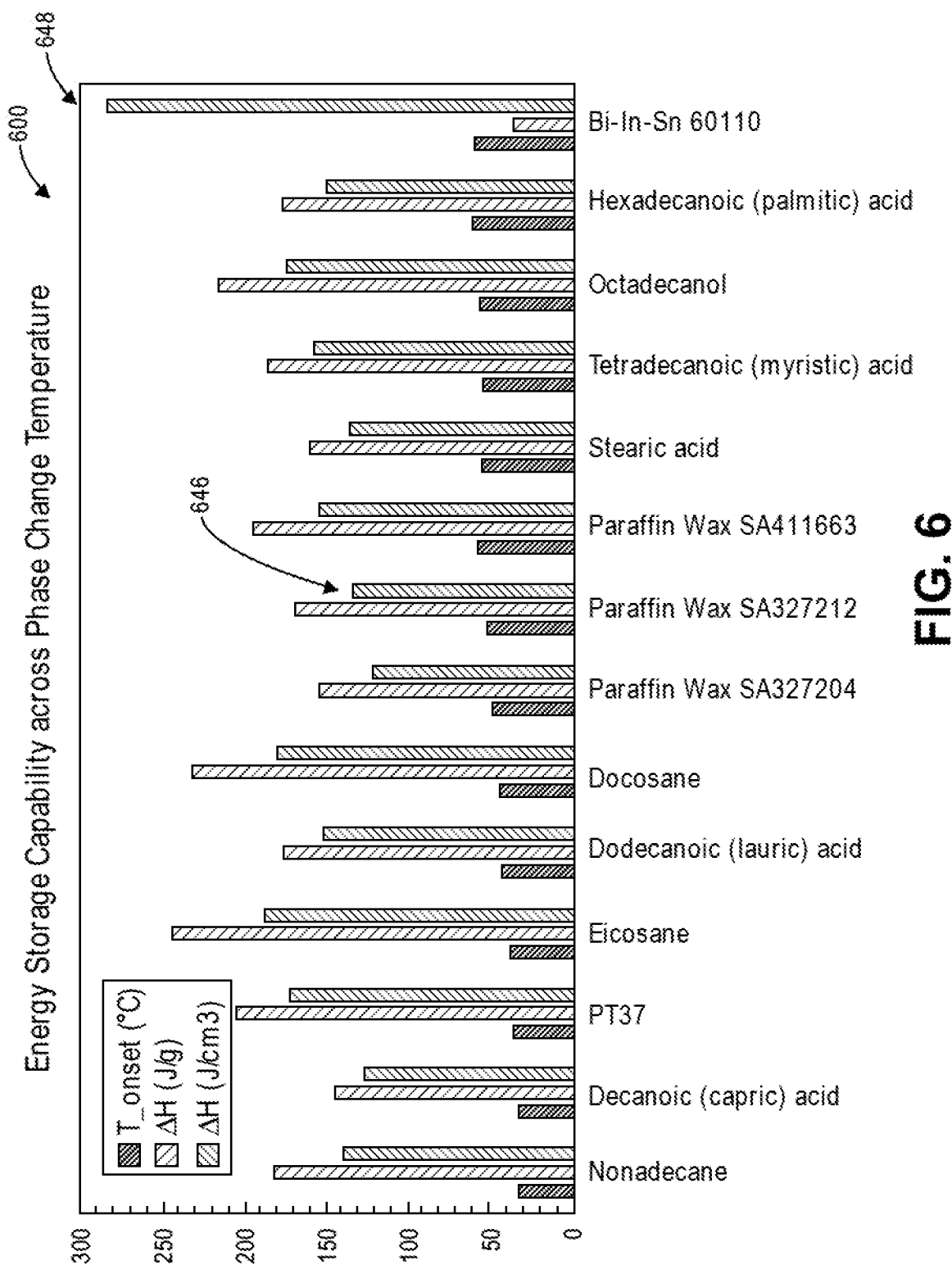
FIG. 6 is an example comparison of energy storage capability across phase change temperature of a TPMA to the 12 popular PCMs, in accordance with embodiments.

FIG. 6 is an example comparison of energy storage capability across phase change temperature of a TPMA to the 12 popular PCMs, in accordance with embodiments. Diagram 600 shows a comparison of energy storage capabilities, which may be referred to as the latent heat of fusion, represented as ΔH. For example, paraffin energy storage 646 at about 130 is about half that of the TPMA energy storage 648.

Figure 7:
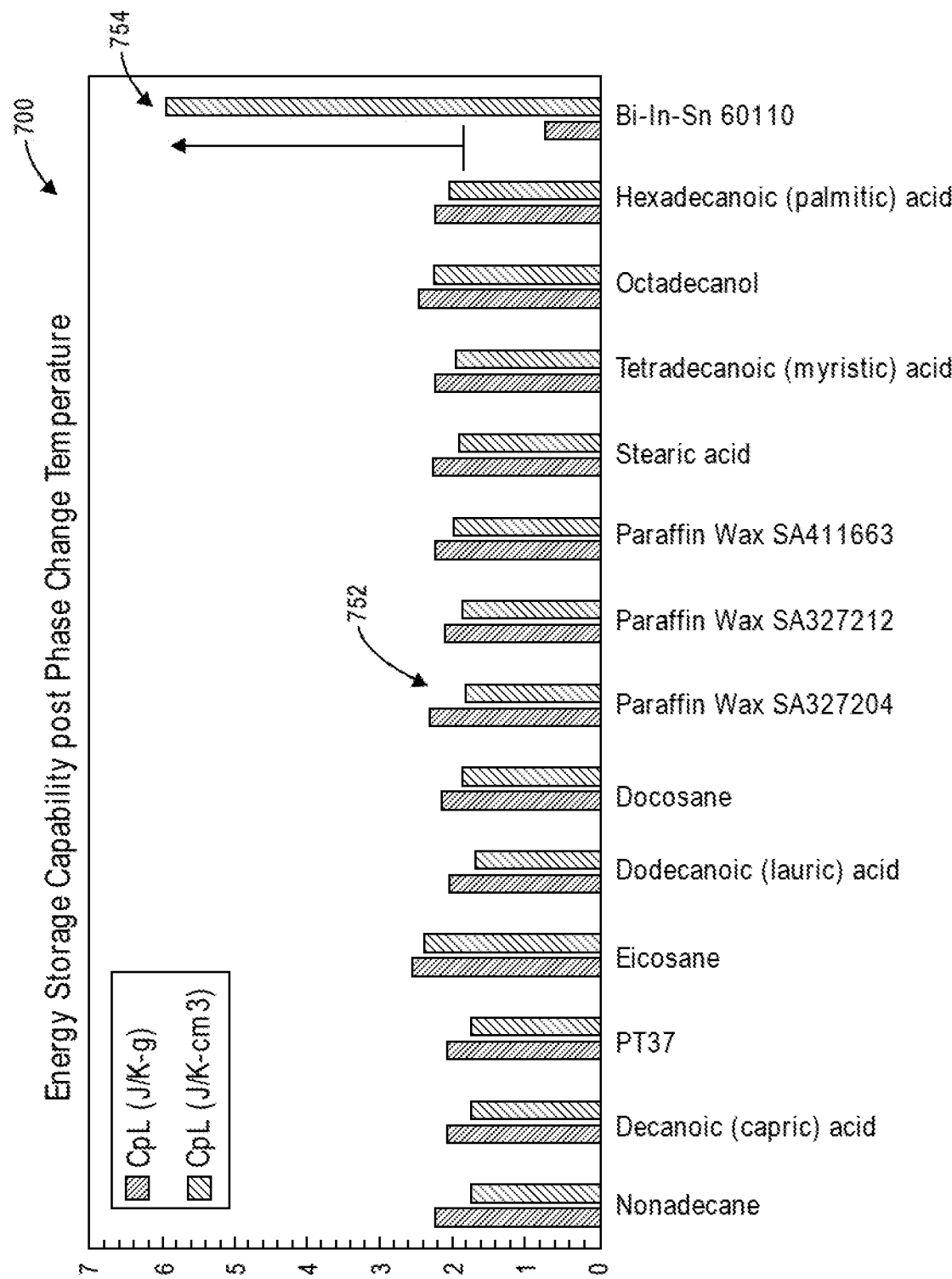
FIG. 7 is an example comparison of energy storage capability post phase change temperature of a TPMA to the 12 popular PCMs, in accordance with embodiments.

FIG. 7 is an example comparison of energy storage capability post phase change temperature of a TPMA to the 12 popular PCMs, in accordance with embodiments. Diagram 700 shows a comparison of energy storage capabilities post phase change temperature, in terms of specific heat ($C_p$). As shown, the TPMA energy storage 754 value of 6, is over three times the paraffin energy storage 752 value of 1.8, and roughly 3 times more than any of the other PCM. As a result, the TPMA is able to store significantly more energy, for example in the form of heat, than other PCM materials that are not two-phase metallic alloys.

Figure 8:
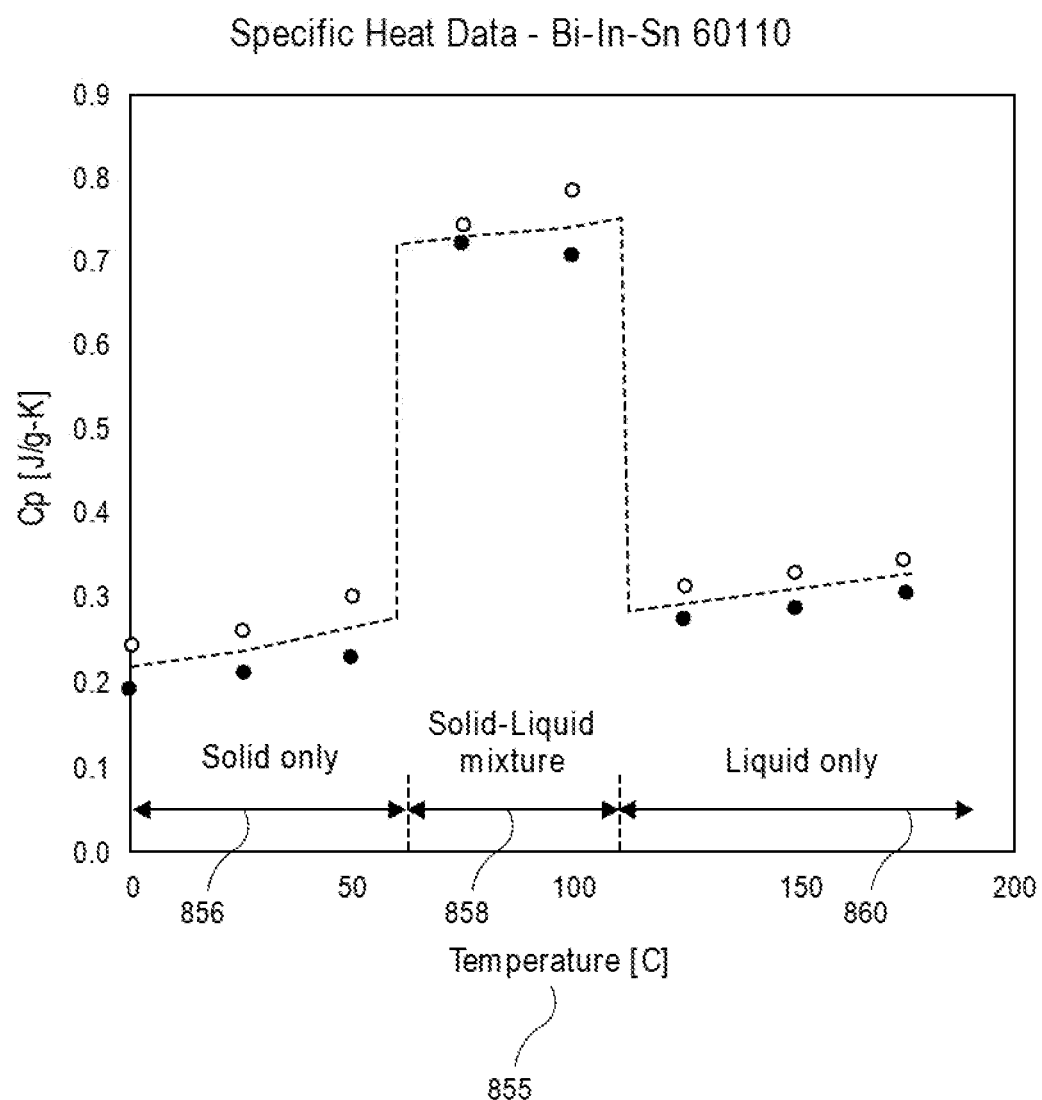
FIG. 8 illustrates energy storage capability of a TPMA in various phases, in accordance with embodiments.

FIG. 8 illustrates energy storage capability of a TPMA in various phases, in accordance with embodiments. Diagram 800 shows a graph of specific heat data over a temperature range 855, where the TPMA alloy is in a solid only state 856, a solid-liquid mixture state 858 and a liquid only state 860. When the TPMA alloy is in a solid-liquid mixture state 858 between liquidus temperature value (e.g., 60° C.) and solidus temperature value (e.g., 110° C.), it provides between two and three times higher energy storage capability.

As discussed before, TPMA offers approximately 3 times higher energy storage capability than other PCMs. This is because TPMA systems can provide both latent and sensible heat storage capabilities over wide, two-phase temperature range (e.g., 60-110° C.). Specific Heat, $C_p$ data of a two-phase metallic alloy (e.g., Bi—In—Sn, two-phase temperature range of 60-110° C.) is shown below. As shown, there is significant enhancement of energy storage capacity in the two-phase temperature range. Note that a typical PCM material provides a latent heat storage capability, i.e, Latent Heat of Fusion, ΔH, cross the fixed, phase-change temperature only.

Figure 9:
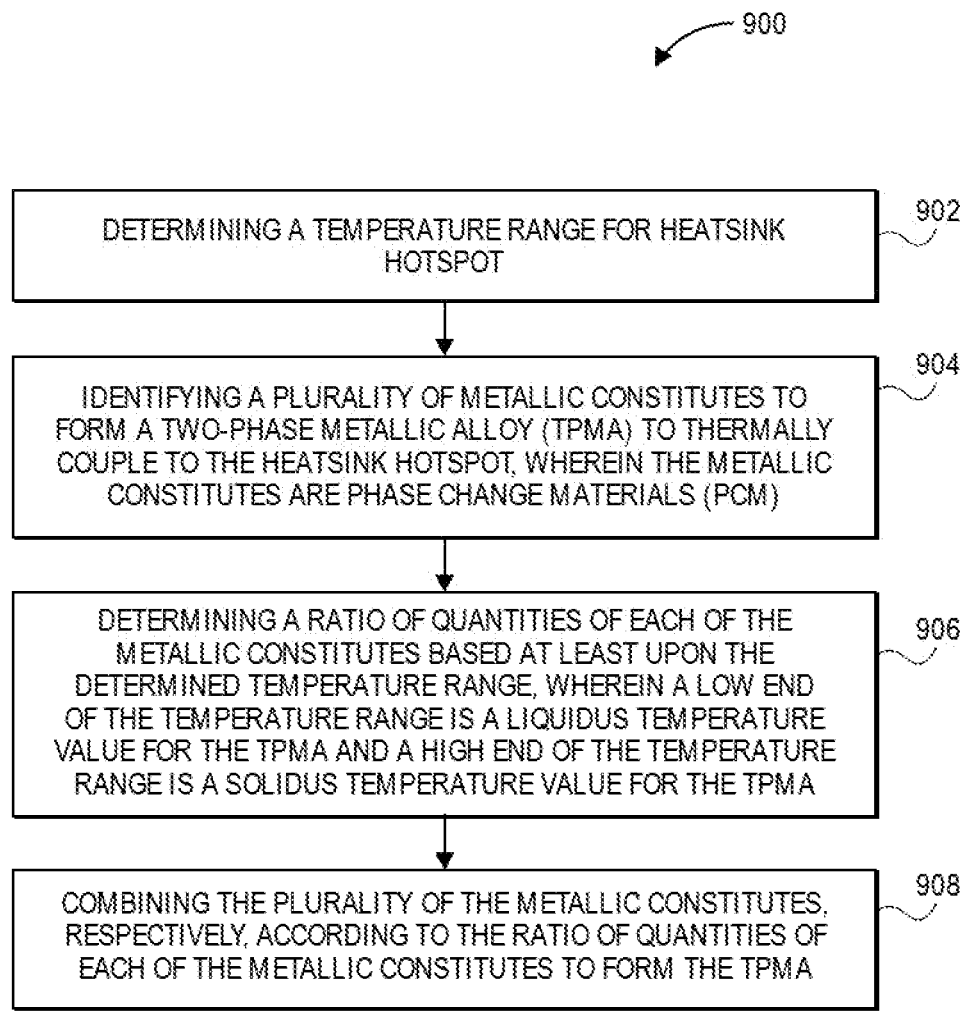
FIG. 9 illustrates an example of a process for manufacturing a TPMA, in accordance with embodiments

FIG. 9 illustrates an example of a process for manufacturing a TPMA, in accordance with embodiments. In embodiments, process 900 may be performed by one or more of the techniques, processes, or actions described with respect to FIGS. 1A-8.

At block 902, the process may include determining a temperature range for heatsink hotspot. In embodiments, the heatsink hotspot may be the gap pad TIM 122 that may be designed to absorb thermal energy within a temperature range determined based on power boosts in the SoC 118 in FIG. 1A. In embodiments, the heatsink hotspot may be a heatsink designed to thermally couple with battery 236 of FIG. 2 to absorb heat within a determined temperature range when the battery 236 is within the thermal runway range. In embodiments, a determined temperature range may a temperature range 858 of FIG. 8 that may indicate a solid-liquid mixture range of two metallic constituents.

At block 904, the process may further include identifying a plurality of metallic constituents to form a TPMA to thermally couple to the heatsink hotspot, wherein the metallic constitutes are PCMs. The identification of the metallic constituents may be based upon the determined temperature range, such as temperature range 858 of FIG. 8 in reference to block 902. For example, the metallic constituents may include Bi, In and Sn.

At block 906, the process may further include determining a ratio of quantities of each of the metallic constituents based at least upon the determined temperature range, wherein a low end of the temperature range is a liquidus temperature value for the TPMA and a high end of the temperature range is a solidus temperature value for the TPMA. In embodiments, the TPMA, for example including Bi, In and Sn, may be selected in ratios, such as ratios described with respect to FIG. 3, to form an off-eutectic temperature range, such as temperature range 858 of FIG. 8, where below that temperature range 858 the TPMA is a liquidus and above that temperature range 858 the TPMA is a solidus.

At block 908, the process may further include combining the plurality of the metallic constituents, respectively, according to the ratio of quantities of each of the metallic constitutes to form the TPMA. In embodiments, the metallic constituents, for example Bi, In and Sn, may be physically combined to form the TPMA.

FIG. 10 is a schematic of a computer system 1000, in accordance with an embodiment of the present invention. The computer system 1000 (also referred to as the electronic system 1000) as depicted can embody a TPMA for thermal energy absorption, according to any of the several disclosed embodiments and their equivalents as set forth in this disclosure. The computer system 1000 may be a mobile device such as a netbook computer. The computer system 1000 may be a mobile device such as a wireless smart phone. The computer system 1000 may be a desktop computer. The computer system 1000 may be a hand-held reader. The computer system 1000 may be a server system. The computer system 1000 may be a supercomputer or high-performance computing system.

In an embodiment, the electronic system 1000 is a computer system that includes a system bus 1020 to electrically couple the various components of the electronic system 1000. The system bus 1020 is a single bus or any combination of busses according to various embodiments. The electronic system 1000 includes a voltage source 1030 that provides power to the integrated circuit 1010. In some embodiments, the voltage source 1030 supplies current to the integrated circuit 1010 through the system bus 1020.

The integrated circuit 1010 is electrically coupled to the system bus 1020 and includes any circuit, or combination of circuits according to an embodiment. In an embodiment, the integrated circuit 1010 includes a processor 1012 that can be of any type. As used herein, the processor 1012 may mean any type of circuit such as, but not limited to, a microprocessor, a microcontroller, a graphics processor, a digital signal processor, or another processor. In an embodiment, the processor 1012 includes, or is coupled with, a patterned thin film capacitor, as disclosed herein. In an embodiment, SRAM embodiments are found in memory caches of the processor. Other types of circuits that can be included in the integrated circuit 1010 are a custom circuit or an application-specific integrated circuit (ASIC), such as a communications circuit 1014 for use in wireless devices such as cellular telephones, smart phones, pagers, portable computers, two-way radios, and similar electronic systems, or a communications circuit for servers. In an embodiment, the integrated circuit 1010 includes on-die memory 1016 such as static random-access memory (SRAM). In an embodiment, the integrated circuit 1010 includes embedded on-die memory 1016 such as embedded dynamic random-access memory (eDRAM).

In an embodiment, the integrated circuit 1010 is complemented with a subsequent integrated circuit 1011. Useful embodiments include a dual processor 1013 and a dual communications circuit 1015 and dual on-die memory 1017 such as SRAM. In an embodiment, the dual integrated circuit 1010 includes embedded on-die memory 1017 such as eDRAM.

In an embodiment, the electronic system 1000 also includes an external memory 1040 that in turn may include one or more memory elements suitable to the particular application, such as a main memory 1042 in the form of RAM, one or more hard drives 1044, and/or one or more drives that handle removable media 1046, such as diskettes, compact disks (CDs), digital variable disks (DVDs), flash memory drives, and other removable media known in the art. The external memory 1040 may also be embedded memory 1048 such as the first die in a die stack, according to an embodiment.

In an embodiment, the electronic system 1000 also includes a display device 1050, an audio output 1060. In an embodiment, the electronic system 1000 includes an input device such as a controller 1070 that may be a keyboard, mouse, trackball, game controller, microphone, voice-recognition device, or any other input device that inputs information into the electronic system 1000. In an embodiment, an input device 1070 is a camera. In an embodiment, an input device 1070 is a digital sound recorder. In an embodiment, an input device 1070 is a camera and a digital sound recorder.

As shown herein, the integrated circuit 1010 can be implemented in a number of different embodiments, including a package substrate having a patterned thin film capacitor, according to any of the several disclosed embodiments and their equivalents, an electronic system, a computer system, one or more methods of fabricating an integrated circuit, and one or more methods of fabricating an electronic assembly that includes a package substrate having a patterned thin film capacitor, according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed package substrates having patterned thin film capacitor embodiments and their equivalents. A foundation substrate may be included, as represented by the dashed line of FIG. 10. Passive devices may also be included, as is also depicted in FIG. 10.

The following paragraphs describe examples of various embodiments.

Example 1 may be an apparatus comprising: a plurality of metallic constituents that form a two-phase metallic alloy (TPMA), wherein the metallic constituents are phase change materials (PCM); wherein the TPMA includes a ratio of quantities of each of the metallic constitutes; wherein the TPMA has a liquidus temperature value and a solidus temperature value and has at least a liquid phase and at least a solid phase when a temperature value of the TPMA is between the liquidus temperature value and the solidus temperature value; and wherein the TPMA, when at a temperature between the liquidus temperature value and the solidus temperature value, is to facilitate thermal energy storage when coupled to a heat source.

Example 2 may include the apparatus of example 1, wherein the quantities are selected one of: weight, volume, or mass.

Example 3 may include the apparatus of example 1, wherein the TPMA, when at a temperature value between the liquidus temperature value and the solidus temperature value, is to store an amount of thermal energy greater than is stored when the TPMA temperature value is below the liquidus temperature value or when the TPMA temperature value is above the solidus temperature value.

Example 4 may include the apparatus of example 1, wherein the liquidus temperature value and the solidus temperature value are determined in part by the ratio of quantities of the metallic constituents.

Example 5 may include the apparatus of example 1, wherein the TPMA includes a selected one of: Bismuth (Bi), Lead (Pb), Tin (Sn), Cadium (Cd), Antimony (Sb), Indium (In), Thallium (Tl), Tellurium (Te), Selenium (Se), Gallium (Ga), or Mercury (Hg).

Example 6 may include the apparatus of claim 1, wherein the TPMA includes a selected one of: Sodium (Na), Lithium (Li), Aluminum (Al), Magnesium (Mg), Silver (Ag), Copper (Cu), Zinc (Zn), Arsenic (As), Potassium (K), Rubidium (Rb), Calcium (Ca), Gold (Au), Silicon (Si), or Germanium (Ge).

Example 7 may include the apparatus of example 1, wherein the TPMA includes one or more materials that are not a PCM.

Example 8 may include the apparatus of example 1, wherein the TPMA is combined with one or more materials that are a PCM.

Example 9 may include the apparatus of example 8, wherein the PCM is a selected one of: Nonadecane, Decanoic (capric) acid, PT37, Eicosane, Dodecanoic (lauric) acid, Docosane, Paraffin, Stearic acid, Tetradecanoic (myristic) acid, Octadecanol, Hexadecanoic (palmitic) acid, Ester, Fatty acid, or Alcohol.

Example 10 may include the apparatus of any one of examples 1-9, wherein the TPMA is to thermally couple to a heat sink of an electrical device.

Example 11 may include a system comprising: a system-on-a-chip (SoC); a heat sink thermally coupled with the SoC, wherein the heat sink comprises: a plurality of metallic constituents that form a two-phase metallic alloy (TPMA), wherein the metallic constituents are phase change materials (PCM); wherein the TPMA has a liquidus temperature value and a solidus temperature value and the TPMA has at least a liquid phase and at least a solid phase when a temperature value of the TPMA is between the liquidus temperature value and the solidus temperature value; wherein the TPMA includes a ratio of quantities of each of the metallic constituents; and wherein the TPMA, when at a temperature between the liquidus temperature value and the solidus temperature value, is to facilitate thermal energy storage of the SoC.

Example 12 may include the system of example 11, wherein the quantities are selected one of: weight, volume, or mass.

Example 13 may include the system of example 11, wherein the TPMA, when at a temperature between the liquidus temperature value and the solidus temperature value, is to store an amount of thermal energy greater than can be stored when the TPMA temperature value is below the liquidus temperature value or when the TPMA temperature is above the solidus temperature value.

Example 14 may include the system of example 11, wherein the liquidus temperature value and the solidus temperature value are determined in part by the ratio of quantities of the metallic constituents.

Example 15 may include the system of example 11, wherein the TPMA includes a selected one of: Bismuth (Bi), Lead (Pb), Tin (Sn), Cadium (Cd), Antimony (Sb), Indium (In), Thallium (Tl), Tellurium (Te), Selenium (Se), Gallium (Ga), or Mercury (Hg).

Example 16 may include the system of example 11, wherein the TPMA a selected one of: Sodium (Na), Lithium (Li), Aluminum (Al), Magnesium (Mg), Silver (Ag), Copper (Cu), Zinc (Zn), Arsenic (As), Potassium (K), Rubidium (Rb), Calcium (Ca), Gold (Au), Silicon (Si), or Germanium (Ge).

Example 17 may include the system of example 11, wherein the TPMA includes one or more materials that are not PCMs.

Example 18 may include the system of example 11, wherein the TPMA is combined with a material that is a PCMs.

Example 19 may include the system of example 18, wherein the PCM is a selected one of: Nonadecane, Decanoic (capric) acid, PT37, Eicosane, Dodecanoic (lauric) acid, Docosane, Paraffin, Stearic acid, Tetradecanoic (myristic) acid, Octadecanol, Hexadeconoic (palmitic) acid, Ester, Fatty acid, or Alcohol.

Example 20 may be a method comprising: determining a temperature range for heatsink hotspot; identifying a plurality of metallic constituents to form a two-phase metallic alloy (TPMA) to thermally couple to the heatsink hotspot, wherein the metallic constituents are phase change materials (PCM); determining a ratio of quantities of each of the metallic constituents based at least upon the determined temperature range, wherein a low end of the temperature range is a liquidus temperature value for the TPMA and a high end of the temperature range is a solidus temperature value for the TPMA; and combining the plurality of the metallic constituents, respectively, according to the ratio of quantities of each of the metallic constituents to form the TPMA.

Example 21 may be the method of example 20, further comprising coupling the TPMA to the heatsink hotspot to facilitate thermal energy storage for heatsink hotspot.

Example 22 may be the method of example 21, wherein the quantities are selected one of: weight, volume, or mass.

Example 23 may be the method of example 20, wherein the determined temperature range is determined in part by the parameters, respectively, of the constitutes.

Example 24 may be the method of example 23, further comprising combining one or more materials with the TPMA that are not PCMs.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated embodiments, including what is described in the Abstract, is not intended to be exhaustive or to limit embodiments to the precise forms disclosed. While specific embodiments are described herein for illustrative purposes, various equivalent modifications are possible within the scope of the embodiments, as those skilled in the relevant art will recognize.

These modifications may be made to the embodiments in light of the above detailed description. The terms used in the following claims should not be construed to limit the embodiments to the specific implementations disclosed in the specification and the claims. Rather, the scope of the invention is to be determined entirely by the following claims, which are to be construed in accordance with established doctrines of claim interpretation.

What is claimed is:

1. An apparatus comprising:
a plurality of metallic constituents that form a two-phase metallic alloy (TPMA), wherein the metallic constituents are phase change materials (PCM);
wherein the TPMA includes a ratio of quantities of each of the metallic constituents;
wherein the TPMA has a liquidus temperature value and a solidus temperature value and has at least a liquid phase and at least a solid phase when a temperature value of the TPMA is between the liquidus temperature value and the solidus temperature value; and
wherein the TPMA, when at a temperature between the liquidus temperature value and the solidus temperature value, is to facilitate thermal energy storage when coupled to a heat source.

2. The apparatus of claim 1, wherein the quantities are selected one of: weight, volume, or mass.

3. The apparatus of claim 1, wherein the TPMA, when at a temperature value between the liquidus temperature value and the solidus temperature value, is to store an amount of thermal energy greater than is stored when the TPMA temperature value is below the liquidus temperature value or when the TPMA temperature value is above the solidus temperature value.

4. The apparatus of claim 1, wherein the liquidus temperature value and the solidus temperature value are determined in part by the ratio of quantities of the metallic constituents.

5. The apparatus of claim 1, wherein the TPMA includes a selected one of: Bismuth (Bi), Lead (Pb), Tin (Sn), Cadium (Cd), Antimony (Sb), Indium (In), Thallium (Tl), Tellurium (Te), Selenium (Se), Gallium (Ga), or Mercury (Hg).

6. The apparatus of claim 1, wherein the TPMA includes a selected one of: Sodium (Na), Lithium (Li), Aluminum (Al), Magnesium (Mg), Silver (Ag), Copper (Cu), Zinc (Zn), Arsenic (As), Potassium (K), Rubidium (Rb), Calcium (Ca), Gold (Au), Silicon (Si), or Germanium (Ge).

7. The apparatus of claim 1, wherein the TPMA includes one or more materials that are not a PCM.

8. The apparatus of claim 1, wherein the TPMA is combined with one or more materials that are a PCM.

9. The apparatus of claim 8, wherein the PCM is a selected one of: Nonadecane, Decanoic (capric) acid, PT37, Eicosane, Dodecanoic (lauric) acid, Docosane, Paraffin, Stearic acid, Tetradecanoic (myristic) acid, Octadecanol, Hexadeconoic (palmitic) acid, Ester, Fatty acid, or Alcohol.

10. The apparatus of claim 1, wherein the TPMA is to thermally couple to a heat sink of an electrical device.

11. A system comprising:
   a system-on-a-chip (SoC);
   a heat sink thermally coupled with the SoC, wherein the heat sink comprises:
      a plurality of metallic constituents that form a two-phase metallic alloy (TPMA), wherein the metallic constituents are phase change materials (PCM);
   wherein the TPMA has a liquidus temperature value and a solidus temperature value and the TPMA has at least a liquid phase and at least a solid phase when a temperature value of the TPMA is between the liquidus temperature value and the solidus temperature value;
   wherein the TPMA includes a ratio of quantities of each of the metallic constituents; and
   wherein the TPMA, when at a temperature between the liquidus temperature value and the solidus temperature value, is to facilitate thermal energy storage of the SoC.

12. The system of claim 11, wherein the quantities are selected one of: weight, volume, or mass.

13. The system of claim 11, wherein the TPMA, when at a temperature between the liquidus temperature value and the solidus temperature value, is to store an amount of thermal energy greater than can be stored when the TPMA temperature value is below the liquidus temperature value or when the TPMA temperature is above the solidus temperature value.

14. The system of claim 11, wherein the liquidus temperature value and the solidus temperature value are determined in part by the ratio of quantities of the metallic constituents.

15. The system of claim 11, wherein the TPMA includes a selected one of: Bismuth (Bi), Lead (Pb), Tin (Sn), Cadium (Cd), Antimony (Sb), Indium (In), Thallium (T1), Tellurium (Te), Selenium (Se), Gallium (Ga), or Mercury (Hg).

16. The system of claim 11, wherein the TPMA a selected one of: Sodium (Na), Lithium (Li), Aluminum (Al), Magnesium (Mg), Silver (Ag), Copper (Cu), Zinc (Zn), Arsenic (As), Potassium (K), Rubidium (Rb), Calcium (Ca), Gold (Au), Silicon (Si), or Germanium (Ge).

17. The system of claim 11, wherein the TPMA includes one or more materials that are not PCMs.

18. The system of claim 11, wherein the TPMA is combined with a material that is a PCMs.

19. The system of claim 18, wherein the PCM is a selected one of: Nonadecane, Decanoic (capric) acid, PT37, Eicosane, Dodecanoic (lauric) acid, Docosane, Paraffin, Stearic acid, Tetradecanoic (myristic) acid, Octadecanol, Hexadeconoic (palmitic) acid, Ester, Fatty acid, or Alcohol.

* * * * *